US009885745B2

(12) United States Patent
Hamilton

(10) Patent No.: US 9,885,745 B2
(45) Date of Patent: Feb. 6, 2018

(54) APPARATUS AND METHOD FOR INTEGRATED CIRCUIT FORENSICS

(71) Applicant: The United States of America as represented by the Secretary of the Navy, Washington, DC (US)

(72) Inventor: Brett J Hamilton, Heltonville, IN (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 93 days.

(21) Appl. No.: 14/996,554

(22) Filed: Jan. 15, 2016

(65) Prior Publication Data

US 2016/0131699 A1  May 12, 2016

Related U.S. Application Data

(62) Division of application No. 14/313,360, filed on Jun. 24, 2014, now Pat. No. 9,322,847.

(60) Provisional application No. 61/838,532, filed on Jun. 24, 2013.

(51) Int. Cl.
| | | |
|---|---|---|
| G01R 31/28 | (2006.01) | |
| G01R 1/07 | (2006.01) | |
| G06F 11/22 | (2006.01) | |
| G06N 3/02 | (2006.01) | |
| G01R 31/00 | (2006.01) | |

(52) U.S. Cl.
CPC ............ *G01R 31/2834* (2013.01); *G01R 1/07* (2013.01); *G01R 31/002* (2013.01); *G01R 31/2872* (2013.01); *G06F 11/2263* (2013.01); *G06N 3/02* (2013.01)

(58) Field of Classification Search
USPC ................................. 324/750.01, 73.1, 76.11
See application file for complete search history.

(56) References Cited

U.S. PATENT DOCUMENTS 6,237,126 B1 * 5/2001 Bonitz ................ G06F 17/5036
703/13

* cited by examiner

*Primary Examiner* — Vincent Q Nguyen
(74) *Attorney, Agent, or Firm* — Christopher A. Monsey

(57) ABSTRACT

A test system including an embodiment having a sensor array adapted to test one or more devices under test in learning modes as well as evaluation modes. An exemplary test system can collect a variety of test data as a part of a machine learning system associated with known-good samples. Data collected by the machine learning system can be used to calculate probabilities that devices under test in an evaluation mode meet a condition of interest based on multiple testing and sensor modalities. Learning phases or modes can be switched on before, during, or after evaluation mode sequencing to improve or adjust machine learning system capabilities to determine probabilities associated with different types of conditions of interest. Multiple permutations of probabilities can collectively be used to determine an overall probability of a condition of interest which has a variety of attributes.

12 Claims, 6 Drawing Sheets

| Step 1 | Position a test assembly comprising a plurality of EM sensors |
|---|---|
| Step 2 | Position a known-good DUT relative to the test assembly |
| Step 3 | Position the plurality of EM sensors at a plurality of locations in relation to DUT in a first sensor configuration |
| Step 4 | Selectively energize the DUT to produce a first EM emission pattern from a plurality of sections on the DUT, wherein said selective energization comprises inputs associated with a test stimulus patterns adapted to enhance or create a detectable EM signature |
| Step 5 | Acquire the first EM emission pattern produced from Step 4 by using said plurality of EM sensors |
| Step 6 | Store the first EM emission pattern |
| Step 7 | Remove the known-good DUT and replace with a second DUT |
| Step 8 | Position the second DUT relative to the test assembly |
| Step 9 | Position the plurality of EM sensors at the plurality of locations in relation to DUT at the first sensor configuration |
| Step 10 | Selectively energize the second DUT to produce a second EM emission pattern from a plurality of sections on the second DUT |

Fig. 6A

APPARATUS AND METHOD FOR INTEGRATED CIRCUIT FORENSICS

CROSS-REFERENCE TO RELATED APPLICATIONS

The present application is a divisional continuation of and claims priority to U.S. patent application Ser. No. 14/313,360, filed on Jun. 24, 2014, entitled "Apparatus and Method for Integrated Circuit Forensics" which claims priority to U.S. Provisional Patent Application Ser. No. 61/838,532, filed Jun. 24, 2013, entitled "Apparatus and Method for Integrated Circuit Forensics," the disclosures of which are expressly incorporated by reference herein.

STATEMENT REGARDING FEDERALLY SPONSORED RESEARCH OR DEVELOPMENT

The invention described herein was made in the performance of official duties by an employee of the Department of the Navy and may be manufactured, used and licensed by or for the United States Government for any governmental purpose without payment of any royalties thereon. This invention (Navy Case 200,338) is assigned to the United States Government and is available for licensing for commercial purposes. Licensing and technical inquiries may be directed to the Technology Transfer Office, Naval Surface Warfare Center Crane, email: Cran_CTO@navy.mil.

BACKGROUND AND SUMMARY OF THE INVENTION

The present invention relates sensing and detection of electrical or other characteristics associated with defective or unauthorized items in a supply chain using multiple detection and data system modalities. Defects or unauthorized status can include parts that do not conform to their specifications, are not authorized by an original equipment manufacturer, a case where a used part is being passed off as a new part, or a case where a part or component has been subjected to one or more damage or stress events exceeding acceptable limit such as electrostatic discharge (ESD) events. System defect or supply chain problem detection is increasingly more difficult given large volumes, difficulty in accessing parts in an assembly, and different sizes, shapes, and input/output structure, particularly for mass produced parts or defect detection for parts that have left a factory. Thus, there is a need to improve electronic system supply chain defect detection capabilities which can be used at any stage in a supply chain.

A common problem with existing methods of acquisition and comparison of parts in a supply chain is that they are generally not good at accounting for normal manufacturing process variations, which can vary with device lots and foundries. Existing methods also tend to focus on a single stress indicator, such as input/output (I/O) shift due to electrostatic discharge (ESD). Thus they do not represent comprehensive evaluation methods.

One embodiment of the invention uses multiple test detection and data collection/input modes coupled with one or more decision engines such as neural networks, image recognition, statistical correlation tools, and decision trees, which can incorporate various learning processes. Another embodiment can also include a data collection system with one embodiment including electromagnetic (EM) sensors and data collection inputs adapted to sense test data and input the data to an embodiment of the multiple mode analysis decision engine to evaluate a device under test (DUT) system. For example, an embodiment of the invention can incorporate integration of multiple EM sensors as well as data inputs and in synchronization with DUT stimulation for the purpose of producing device unique EM signatures accompanied by a decision engine, including a neural engine, to provide a variety of novel embodiments of the invention to meeting a variety of supply chain item defect or unauthorized item detection needs.

An exemplary embodiment can apply a decision engine to multiple electrical characteristic modalities data sets for the purpose of determining a probability that a microelectronic device is unauthorized, does not meet specification(s), or is defective. Inputs to an exemplary decision engine can include a variety of potential data sets that can be evaluated. The additional information obtained in applying multiple data sets in combination with a sensor system that can be used with a wide variety of DUTs, both in a factory and elsewhere, will allow a much more accurate probability assessment of DUTs. Testing systems can also use various methods for measuring different stressors that would indicate a part has, for example, been previously used or stressed (thus is unacceptable or does not meet specification(s)), such as experiencing an ESD damage event.

An exemplary stimulus could be applied in such a way as to produce device dependent signatures useful in determining a probability that a device has a defect, improper part installed, or has otherwise experienced environmental stress. An exemplary EM apparatus may include a positioning system, switch matrix, power combiner, switch and electromagnetic interference (EMI) shielding to minimize stray EMI signals. An exemplary embodiment can also combine various probe types, such as E-field, and H-field probes of varying bandwidths, as well as visual, infra-red, etc in an integrated manner.

Additional features and advantages of the present invention will become apparent to those skilled in the art upon consideration of the following detailed description of the illustrative embodiment exemplifying the best mode of carrying out the invention as presently perceived.

BRIEF DESCRIPTION OF THE DRAWINGS

The detailed description of the drawings particularly refers to the accompanying figures in which:

FIGS. 6A and 6B show an exemplary processing sequence in accordance with one embodiment of the invention.

DETAILED DESCRIPTION OF THE DRAWINGS

The embodiments of the invention described herein are not intended to be exhaustive or to limit the invention to precise forms disclosed. Rather, the embodiments selected for description have been chosen to enable one skilled in the art to practice the invention.

Figure 1:
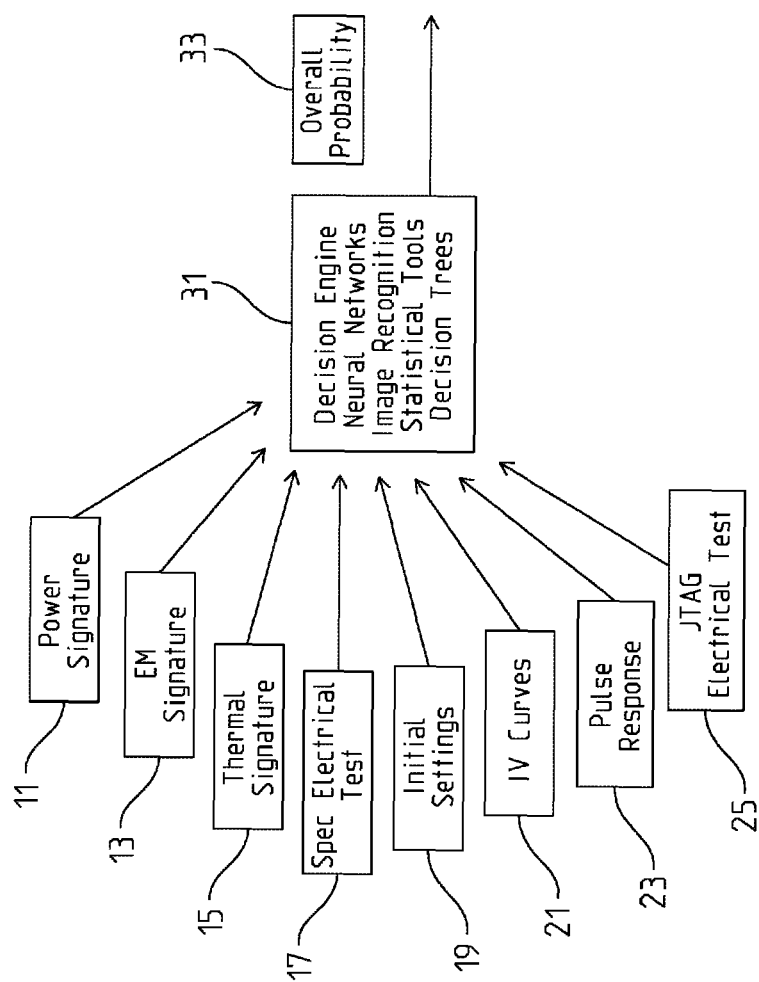
FIG. 1 shows a block diagram with a decision engine with multiple capabilities along with possible inputs to the decision engine and an exemplary output in accordance with one embodiment of the invention.

One aspect of the invention can include use of a decision engine to evaluate multiple electrical characteristic modalities and data sets for the purpose of determining a probability that a DUT, e.g., a microelectronic device, is an unauthorized, counterfeit, damaged, non-conforming to specification(s), or a defective item. Referring to FIG. 1, a conceptual block diagram is shown displaying some potential data sets (e.g., 11, 13, 15, 17, 19, 21, 23, 25) that can be evaluated by an embodiment of the invention. Application of multiple data sets can enable a high accuracy probability determination of a particular condition or status associated with a DUT such as discussed above. Various methods measure different aspects of a DUT which can be correlated. For example, certain indicators associated with damage events, e.g., stressors, that indicate a DUT or part has, for example, been previously used or stressed, such as previously experiencing an ESD event.

Referring to FIG. 1, some exemplary data inputs used with one aspect of an exemplary embodiment of the invention are shown. Power signature data (PSD) 11 can include data captured on an oscilloscope which shows DUT operational current vs time. PSD 11 can be taken under various conditions including in synchronization with DUT stimulation from automatic test equipment (ATE). Output PSD 11 can be an electrical current signature.

Exemplary embodiments can include output from E-field or H-field probes which measure EM emissions from a DUT. Electromagnetic Signature Data (EMSD) 13 can be taken under various conditions including in synchronization with DUT stimulation from ATE. EMSD 13 exemplary output can include a field emission map in a frequency or time domain.

Thermal Signature Data (TSD) 15 can be produced by an infrared (IR) imager that captures an IR image of a DUT. TSD 15 can be taken under various conditions including in synchronization with DUT stimulation from ATE. TSD 15 output can include a thermal map of a DUT surface.

Specification (Spec) Electrical Test Data (SETD) 17 can be produced or determined based on, for example, benchmark testing or a manufacturer(s)' data sheet. SETD 17 based test data output can include creation of, e.g., an ASCII data file containing DUT test results per test per pin for a DUT which is then compared with SETD 17 associated with a genuine, authorized, or undamaged baseline comparison DUT. SETD 17 for a genuine, authorized, or undamaged baseline or comparison DUT can be created by applying a predetermined plurality of inputs (e.g., benchmark testing, or manufacturer data or data sheet) to the genuine, authorized, or undamaged DUT with a SETD 17 data set.

Initial Settings Data (ISD) 19 can include data initially read from a DUT. ISD 19 could take the form of user data in an EEPROM or user ID or security bits set. For new parts, some or all data/setting associated with ISD 19 can be factory default settings.

Current vs. Voltage (IV) Curve (IVC) data 21. Traditional IV curve forces or injects a voltage and measures a resulting current. IVC data 21 can be obtained with an embodiment that may incorporate ATE or another embodiment can include a dedicated automated tester for ESD detection.

Pulse Response Data (PRD) 23 can be obtained by one embodiment which can include an ESD tester which can apply a pulse for measurement on one or more EM probes or with an oscilloscope providing per pin pulse response. PRD 23 can include an exemplary output including a frequency or time domain waveform or frequency map.

Joint Test Action Group (JTAG) Electrical Test Data (JTAGETD) 25. JTAG is the common name for the IEEE 1149.1 Standard Test Access Port and Boundary-Scan Architecture. JTAGETD 25 can be used for testing printed circuit boards and internal DUT testing such as logic built in self-test (LBIST). JTAGETD 25 can be used to set or read levels on I/O pins via boundary scan, initiate LBIST or program internal memory. JTAGETD 25 output can include an embodiment with a test signature.

Input data, such as discussed above and shown in FIG. 1, can be input into a Decision Engine 31 (e.g., neural networks, image recognition, statistical tools, and/or decision trees) to calculate on Overall Probability 33 that a DUT, e.g., a microelectronic device, is an unauthorized, counterfeit, damaged, non-conforming to specification(s), or a defective item.

Figure 2:
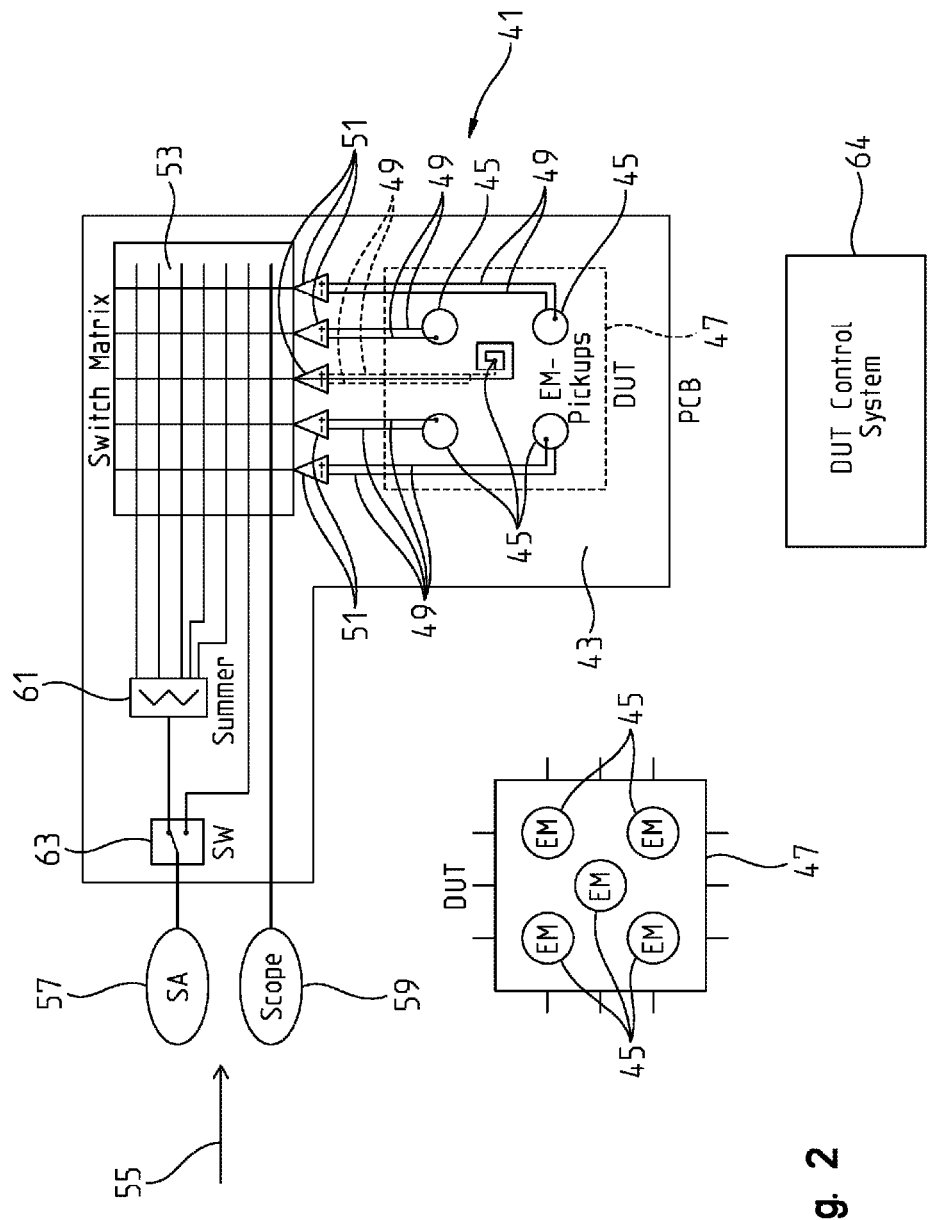
FIG. 2 shows an exemplary schematic diagram of one aspect of one example embodiment of the invention.

FIG. 2 shows an exemplary schematic diagram of one aspect of one example embodiment of the invention. A DUT Testing Assembly 41 is shown which includes a support fixture 43 which supports or positions EM sensors, e.g. EM probes, 45 positioned over a DUT 47. Signal paths 49 connect EM sensors 45 with amplifiers 51. Amplifiers 51 are coupled with a Signal Analysis Section 55 which provides signal analysis in a time domain and/or a frequency domain. For example, amplifiers 51 can be coupled with a Signal Analysis Section 55 comprising a signal analyzer 57 and an oscilloscope 59 via a switch matrix 53. Separate connections (not shown) to the Signal Analysis Section 55 can be used or a summing section 61 can be used which combines output from one or more amplifiers into a composite signal for input into the Signal Analysis Section 55. A switch 63 can be interposed between the Signal Analysis Section 55 and the summing section 61. The EM sensors 45 can be adapted to be repositionable or movable to be placed over specific areas of interest of a particular DUT 47.

One embodiment of the invention can include armatures (not shown) for use with an exemplary embodiment, e.g., a FIG. 2 system, to position an exemplary EM sensor 45 over areas of interest on a DUT 47. An exemplary embodiment can include servos or mechanisms to move the EM sensors 45 over a DUT 47 for repeatable measurements to include multiple different identical DUTs 47 or multiple measurements including measurements in multiple positions relative to a DUT 47.

An exemplary embodiment of a DUT Testing Assembly 41 can include a multiplexer or switching system to permit selection of a single or any combination of EM sensors 45. A multiplexer can provide an ability to dynamically combine different EM sensors serving as array elements, minimizing signal acquisition time and quantity of data, while maintaining richness of signature information. A multiplexer can also perform a function of a switch matrix 53 such as in FIG. 2.

A power combiner may be used to perform a function of a summing section 61. Such a power combiner would enable combination of signals selected by the multiplexer in a desirable manner e.g., to be combined in a manner maintaining 50 ohm impedance.

A plurality of EM sensors 45 can be formed into an array configuration to detect particular EM emissions such as a particular EM emission pattern from a particular set of components on a DUT 47 forming an EM signature pattern.

An embodiment of the invention can include multiple types of EM sensors. For example, the plurality of EM sensors 45 can include combinations of E-field and H-field sensors of various bandwidths. An embodiment of the invention using an array allows optimizing signal quality for a given technology and acquisition environment.

An embodiment of the invention can also include a DUT Control System 64 adapted to input a Known Good (KG) DUT Test Pattern Control Signals (KGDUTTPCS) (not shown) into a KG DUT 47 in order to stimulate the KG DUT 47 to produce signal characteristics to include a KG EM Signature Profile (KGEMSP) for the KG DUT 47. KGEMSP data can include some or all of the data shown in FIG. 1. At least one KGEMSP is acquired by the array of EM Sensors 45 which are positioned in a KG DUT EM Sensor Position (KGDUTEMSP) then stored for later comparison as a First EM Signal Pattern or KGEMSP. The DUT Testing Assembly 41 can then be configured to receive a second DUT, including components found in the first or KG DUT having a relative same or similar physical configuration. The EM Sensors 45 array can then be repositioned to substantially match the first EM Sensors 45 array pattern based on stored KGDUTEMSP associated with the first or KG DUT 47; then the DUT Testing Assembly 41 and DUT Control System 64 next stimulates the second DUT 47'(not shown) using the KGDUTTPCS associated with the KG DUT 47. The second DUT 47' then produces a second or Under-Test (UT) EM Signature Pattern (UTEMSP) which is then acquired by the array of EM sensors 45 and stored as the second or UTEMSP. The First and Second EM Signature Patterns (KGEMSP and UTEMSP) are then compared and a determination of whether or not the second DUT 47' is an acceptable DUT or unacceptable DUT; where an acceptable DUT determination is made where a substantial match between the First and Second EM Signature Pattern indicates the Second DUT 47' is a good DUT and a significant mismatch between the first and second EM signal pattern indicates the second DUT 47' is a defective DUT.

The DUT Control System 64 can also include an ability to store KG DUT 47 configuration identification data and associated EM Signature Patterns for KG DUTs (e.g., KGEMSP). Such DUT configuration identification data, including some or all data described in relation to FIG. 1, can include optically or electrically detectable patterns which can be associated with a KG DUT 7 and its stored KGEMSP as well as EM Sensor 45 array configurations/positions and KGDUTTPC used to generate the known-good DUT's KGDUTTPC.

An embodiment of the DUT Control System 64 can also be adapted to couple with the Signal Analysis Section 55 to receive outputs of the Signal Analysis Section 55 and also to control EM sensor 45 positions and also to control devices or circuits positioned between EM Sensors 45 and the Signal Analysis Section 55. An embodiment of the DUT Control System 64 can also include a storage medium adapted to store and output a plurality of machine readable instructions adapted to control various aspects of the invention including the DUT Control System 64 and DUT Testing Assembly 41 as well as providing for an output capability including a user interface.

An exemplary user interface can include a graphical user interface (GUI) (not shown) which can provide a graphical depiction of circuit behavior, EM Signature Pattern comparison or overlays showing differences or no differences in detected EM signature patterns (e.g., comparison between the first and second EM Signature Patterns) as well as a graphical indication of portions of a second DUT which are producing a non-matching EM Signature. Data, such as shown in related to FIG. 1, can also be displayed along with correlations of different DUT data including some or all of the data shown in FIG. 1. A user interface can also store data structures with selected test information to include EM Signature Pattern Data, mismatch data, and second or DUT 47 characteristic comparison with a DUT 47' for match, identification, and/or probability determination.

The DUT Control System 64 can also include a plurality of machine-implemented processing instructions stored on a digital recording media or other media such as a programmable logic structure to provide additional analytical processing such as a determination of probability of defects associated with a second DUT 47'. A plurality of inputs can also be provided to the DUT Control System 64 to permit a wide variety of KGDUTTPCS to include power signatures, EM signatures, thermal signatures, specific electrical test inputs, initial settings on a second DUT 47', electrostatic discharge (ESD), different input power or signal curves, pulse responses, or specific standard electrical tests as well as some or all of the input types or data show in FIG. 1. Additional sensors can be added to an embodiment of the invention to include thermal sensors which create a KG thermal sensor pattern which is then matched against a DUT 47' thermal sensor output after application of one or more KGDUTTPCS. Image recognition software can be included in another embodiment of the invention to permit matching of thermal pictures or images of a KG DUT 47 with a second DUT 47' to determine good or no-good DUT determinations.

Figure 3:
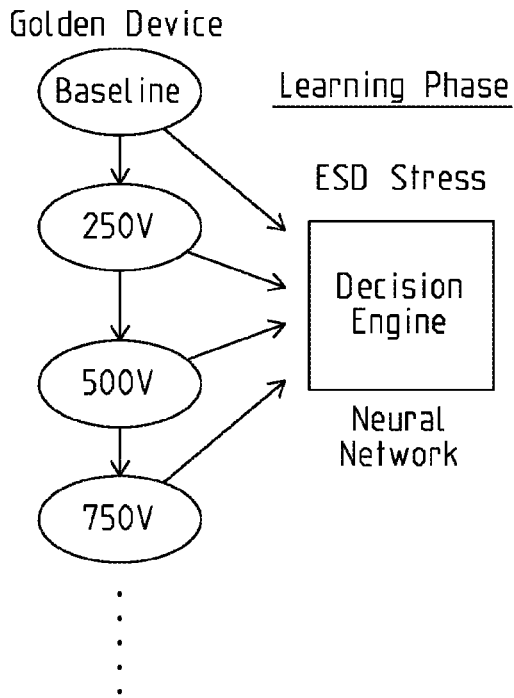
FIG. 3 shows a learning phase for ESD stress in accordance with one embodiment of the invention.

Processes and apparatuses incorporate a learning phase approach, both initial and during supply chain testing, in combination with a multi-modal test system can be provided to produce different types of test data for input and processing with different types of decision engines. Multi-modality electrical test data set evaluation based on a machine learning decision engine can be used to enable detection of counterfeit, unauthorized, undesirable, nonconforming, damaged, aged, and/or environmental stressed devices. An embodiment of the invention can produce probabilities that an engineer can take into account along with non-electrical based factors to help determine the likelihood that a given part is counterfeit, unauthorized, undesirable, nonconforming, damaged, aged, and/or environmentally stressed. An initial test can be done to compare a known-good article or to test set of similar types of type of electrical component testing apparatus can be positioned FIG. 3 shows a learning phase for ESD stress. For IV curve signatures, the primary indicator of ESD induces stress; a similar device manufactured in the same technology with similar I/O structures can be used for the learning phase. A system, such as described herein, can be adapted to induce ESD stress and measure effects on a DUT 47'. The data of the measured effects on a DUT 47' can then be recorded and provided to the system. Different types of ESD stress can be induced. A variety of ESD related stress tests can be used with this aspect of the invention. For example, an escalating series of voltage or electrical discharges can be applied or exposed to a known-good DUT such as, e.g., a baseline or non-stress input then 250 volts, 500 volts, 750 volts, etc which are measured by a testing system, such as described above, with data input into an analysis system, which could include a decision engine (including, e.g., a neural network), during a stress test learning phase. The decision engine could then store test output results and then use the stored results along with decision logic, e.g., artificial intelligence and/or neural networks, to evaluate DUTs in a supply chain scanning system.

Figure 4:
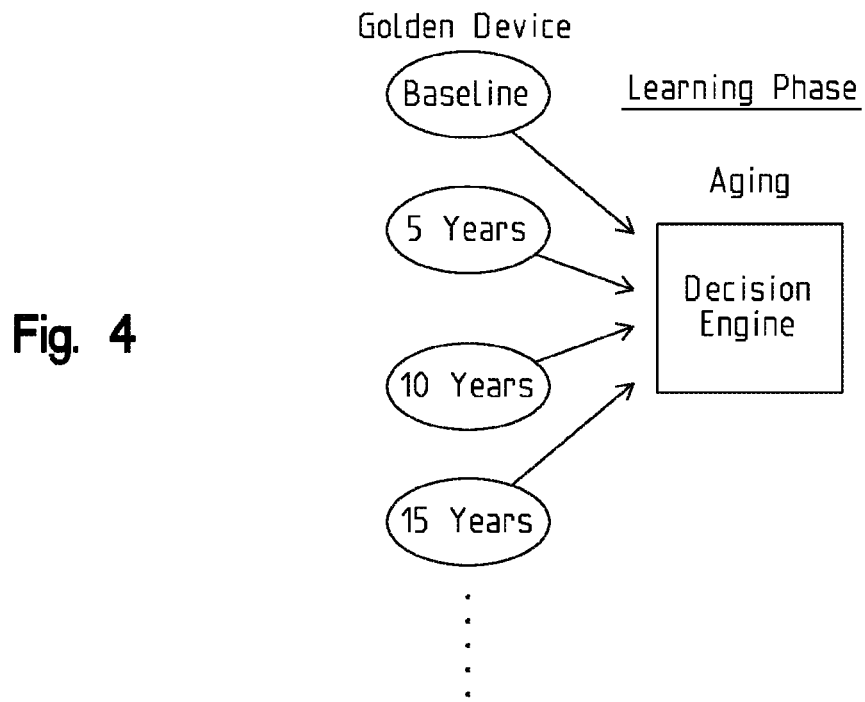
FIG. 4 shows a learning system adapted for use in testing associated with ageing of electronics or other parts in accordance with one embodiment of the invention.

FIG. 4 shows a learning system adapted for use in testing associated with ageing of electronics or other parts in accordance with one embodiment of the invention. For example, accelerated life burn-in processes can be used to age a part or DUT. At predetermined times based on the technology and the burn-in environment, the part or DUT is retested to provide data for that equivalent age. For example, an escalating series of aging-effect-producing processes (e.g., new known-good (baseline), five years, 10 years, 15 years, etc) can be applied or exposed to a known-good DUT which is measured by a testing system, such as described above, with data input into an analysis system, which could include a decision engine (including, e.g., a neural network), during an ageing test learning phase. The exemplary decision engine could then store test output results and then use the stored results along with decision logic, e.g., artificial intelligence and/or neural networks, to evaluate DUTs in a supply chain scanning system. Accelerated life test of sacrificed parts with unknown pedigrees could provide data pertaining to the remaining life for that particular device. While not as good as an ideal known-good device, such testing can be useful to determine remaining life for reliability purposes.

Figure 5:
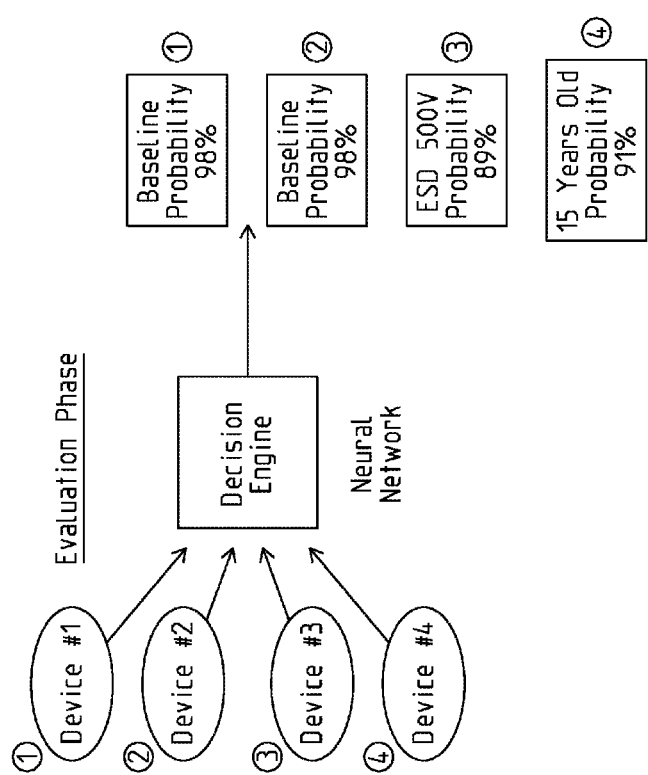
FIG. 5 shows an exemplary evaluation in accordance with one embodiment of the invention.

FIG. 5 shows an exemplary evaluation in accordance with one embodiment of the invention such as for a given data set type (e.g., an IV curve). A variety of devices, parts, or DUTs can be tested using a system such as described herein based on information obtained during learning phases, such as described above. Testing information or data is fed into a decision engine having a machine learning system, such as a neural network, and then a variety of outputs can be produced in view of a desired probability or condition. Example probabilities can include probabilities relative to a baseline and specific condition categories such as ESD and/or ageing. One embodiment can also test for a combination of conditions which have been shown to correlate with a condition of interest such as whether a DUT is genuine, counterfeit, damaged, tampered, or from a specific unauthorized source where correlation of the combination of factors increases confidence in a particular probability determination. Exemplary output can include a condition (such as an energy dispersive x-ray spectrometry (EDS)) equivalent to 250V or device age equivalent to 5 years of use) along with an associated probability of a part or DUT meeting a condition of interest such as counterfeit, genuine, damaged, aged, non-conforming to a specification, etc. An exemplary probability will rarely be a 100% good/bad type number because the data contain noise, but more importantly a condition of a real counterfeit or category of a condition of interest will almost never be directly equivalent to the condition of the device used to train a learning system such as described herein. For example, a system might be trained for ESD stress using a sequence such as; 1) baseline, 2) 250V, 3) 500V, 4) 750V and 5) 1000V, while the counterfeit device being evaluated might have experienced an ESD event of 675V. In this example the probability would be greater for 750V, but not a direct correlation.

In this example, a number of data sets used can vary from device type to device type and also based on available resources. Once all or some data sets have been individually evaluated they are combined for evaluation as shown in FIG. 1 to calculate Overall Probability 33. This step can use neural nets and/or a decision tree based on the technology, number and types of data sets that were applied.

Figure 6B:
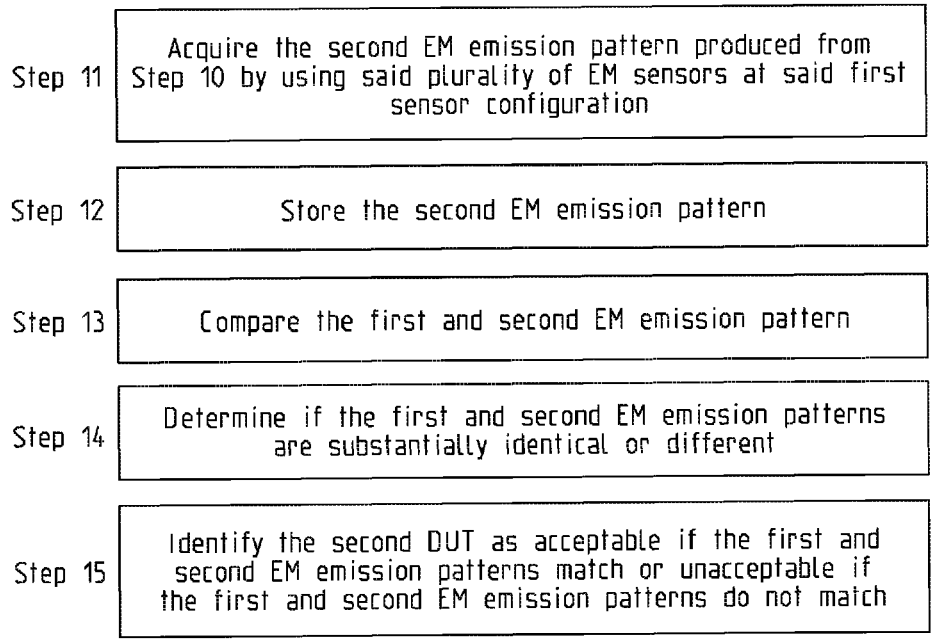

FIGS. 6A and 6B show an exemplary processing sequence in accordance with one embodiment of the invention. At Step 1: position a test assembly comprising a plurality of EM sensors; At Step 2: position a known-good DUT relative to the test assembly; At Step 3: position the plurality of EM sensors at a plurality of locations in relation to DUT in a first sensor configuration; At Step 4: selectively energize the DUT to produce a first EM emission pattern from a plurality of sections on the DUT, where selective energization includes inputs associated with a test stimulus patterns adapted to enhance or create a detectable EM signature; At Step 5: acquire the first EM emission pattern produced from Step 4 by using the plurality of EM sensors; at Step 6: store the first EM emission pattern; At Step 7: remove the known-good DUT and replace with a second DUT; At Step 8: position the second DUT relative to the test assembly; At Step 9: position the plurality of EM sensors at the plurality of locations in relation to DUT at the first sensor configuration; At Step 10: selectively energize the second DUT to produce a second EM emission pattern from a plurality of sections on the second DUT; At Step 11: acquire the second EM emission pattern produced from Step 10 by using said plurality of EM sensors at said first sensor configuration; At Step 12: store the second EM emission pattern; At Step 13: compare the first and second EM emission pattern; At Step 14: determine if the first and second EM emission patterns are substantially identical or different; At Step 15: identify the second DUT as acceptable if the first and second EM emission patterns match or unacceptable if the first and second EM emission patterns do not match.

One advantage of one embodiment of the invention includes providing an ability for users to implement an optimal design for a selected or target technology and permit rapid evaluation by creating a testing assembly, e.g., printed circuit board, with only sensor array elements, position of such elements and signal inputs for a control mechanism needing to be modified.

Although the invention has been described in detail with reference to certain preferred embodiments, variations and modifications exist within the spirit and scope of the invention as described and are defined in the following claims.

The invention claimed is:

1. An apparatus for testing including measuring electromagnetic emissions and determining defective components comprising:
   a sensor array comprising a plurality of sensors adapted to be moveable;
   a signal analysis section comprising a section comprising a time domain and signal domain signal analysis signal section;
   a device under test (DUT) holder adapted to hold and position a first and second DUT relative to the sensor array;
   a DUT stress application section adapted to generate one or more DUT stress conditions to said first DUT which correlate with life cycle age or a life cycle reduction event associated with said DUT, where said DUT stress condition associated with life cycle age is applied by an escalating series of burn-in or heating conditions applied to said first DUT, said DUT life cycle reduction event comprises electrostatic discharge application to at least one section of said first DUT;
   a control mechanism adapted to independently position elements of said sensor array relative to areas of interest on said first and second DUT based on a first position input;
   a DUT control section comprising a machine readable storage medium adapted to receive and store a plurality of machine readable instructions operable to control said apparatus and said first and second DUTs, said machine readable storage medium further comprises a first plurality of machine readable instructions adapted to operate said control mechanism in order to acquire and store a plurality of first sensor array signature data associated with said sensor array outputs from said first DUT based on a first plurality of test signal control inputs to said first DUT and said first position input while one or more said DUT stress conditions are applied to said first DUT, wherein each of said plurality of said first sensor array signature data is respectively associated with said one or more DUT stress conditions;

wherein said DUT control section further comprises a second plurality of machine readable instructions stored on said machine readable storage medium adapted to stimulate said second DUT when said second DUT is placed in said DUT holder with said first plurality of test signal control inputs, said DUT control section further comprises a third plurality of machine readable instructions stored on said machine readable storage medium adapted to acquire a plurality of second sensor array signature data associated with said sensor array outputs from said second DUT based on said first plurality of test signal control inputs to said second DUT and said first position input;

wherein said DUT control section further comprises a fourth plurality of machine readable instructions stored on said machine readable storage medium adapted to match said first and second sensor array signature data associated respectively with said first and second DUT, wherein a substantial match of said signature data indicates a first condition associated with said second DUT and a non-match indicates a second condition associated with said second DUT;

an input and output section adapted to interact with said DUT control section, said input and output section comprising a user interface including a graphical user interface adapted to display an indication of said first or second condition associated with said second DUT.

2. An apparatus as in claim 1, wherein said first condition comprises a DUT acceptable data indicator and said second condition comprises a DUT unacceptable data indicator.

3. An apparatus as in claim 1, wherein said fourth plurality of machine readable instructions comprises a decision engine and rule base comprising a plurality of data sets associated with a plurality of conditions comprising said first and second conditions, said decision engine and said rule base are operable for determining a probability that said second DUT is associated with one or more of said plurality of conditions, wherein said first condition comprises an authorized or meets specification condition and said second condition comprises an unauthorized, does not meet specification, or is defective condition.

4. A testing system including a system for measuring electromagnetic emissions and determining defective components comprising:

a sensor system means adapted to test one or more devices under test (DUT) in learning as well as evaluation modes, said sensor system means is adapted to collect a variety of test data as a part of a machine learning system associated with a known-good said one or more DUT samples subjected to simulated or generated condition of interests comprising stimulation of sections of said known-good DUT and application of one or more stress events to said known-good DUT sample, said data collected by the machine learning system is operable to calculate probabilities data that an unknown-good DUT in an evaluation mode substantially matches a condition of interest comprising a DUT acceptance data or a DUT rejection data; and an input section and an output section adapted to output said probabilities data associated with said unknown-good DUT;

wherein learning modes are switched on before, during, or after evaluation mode sequencing to improve or adjust machine learning system capabilities to determine said probabilities associated with different types of said conditions of interest wherein said system are adapted to determine multiple permutations of said probabilities that are collectively used to determine an overall probability of one or more said conditions of interest which has a variety of attributes associated with one or more said DUT acceptance data and DUT rejection data.

5. A system as in claim 4, wherein said learning and evaluation system include an artificial intelligence system comprising a neural network or a decision engine comprising a plurality of rules associated with generating said probabilities data.

6. A system as in claim 4, wherein said learning and evaluation system are adapted for determining a probability that DUT comprising a microelectronic device is unauthorized, does not meet specification(s), or is defective.

7. A testing system comprising:

a plurality of device under test (DUT) measurement and data collection/input sections comprising electromagnetic (EM) spectrum sensors and data collection sections adapted to apply a plurality of stimulation inputs to a plurality of points on a known-good and an unknown-good DUT and respectively sense a first and second plurality of test data from said known-good and unknown good DUTs, wherein said plurality of stimulation inputs applied to said known-good DUT is applied during synchronized application of one or more life cycle simulation stress environments are applied to said known-good DUT comprising one or more of a group comprising electrostatic stress and ageing events comprising burn-in or heating of said known-good DUT associated with operational or functional capability conditions of said known-good DUT during specific points of said known-good DUT's service life;

one or more decision engine sections respectively associated with said plurality of DUT measurement and data collection/input sections, said one or more decision engine sections comprising a neural network, image recognition, statistical correlation section, and decision tree section, said one or more decision engines adapted to operate said DUT in a learning mode and an evaluating mode, said one or more decision engines are further adapted to receive said first and second test data from said collection/input modes at a first and second stage operable to enable said learning mode associated with said operational or functional capability conditions of said known-good DUT during its service life;

a control section operable to input said first and second test data into said multiple mode analysis decision engine to evaluate said unknown-good DUT, wherein control section is adapted for integration of said multiple EM sensors as well as said data inputs in synchronization with said plurality of DUT stimulation inputs to produce known-good DUT unique EM signatures usable by said decision engine to detect said operational or functional capability conditions of said known-good DUT in said unknown-good DUTs during said second stage;

wherein said one or more decision engines in said evaluating mode further evaluates multiple electrical characteristic modalities data sets associated with said operational or functional capability conditions of said known-good DUT during its service life with said second test data so as to determine a probability that said unknown-good DUT is unauthorized, does not meet specification(s), or is defective.

8. A testing system as in claim 7, wherein said EM spectrum sensors and data collection sections comprise a positioning system, switch matrix, power combiner, switch and EM interference (EMI) shielding to isolate or shield from EMI signals .

9. A testing system as in claim 8, wherein said EM sensors further comprise probe types including one or more from the group comprising an E-field or H-field probe of varying bandwidths, visual, infra-red sensors.

10. A testing apparatus including systems for for measuring electromagnetic emissions and determining defective components comprising:
- a sensor array comprising a plurality of sensors adapted to be moveable;
- a signal analysis section comprising a section comprising a time domain and signal domain signal analysis signal section;
- a device under test (DUT) holder adapted to hold and position a first and second DUT relative to the sensor array;
- a DUT stress application section adapted to generate one or more DUT stress conditions to said first DUT which correlate with life cycle age or a life cycle reduction event associated with said DUT, where said DUT stress condition associated with life cycle age is applied by an escalating series of burn-in or heating conditions applied to said first DUT, said DUT life cycle reduction event comprises electrostatic discharge application to at least one section of said first DUT;
- a control mechanism adapted to independently position elements of said sensor array relative to areas of interest on said first and second DUT based on a first position input;
- a DUT control section comprising a machine readable storage medium adapted to receive and store a plurality of machine readable instructions operable to control said apparatus and said first and second DUTs, said machine readable storage medium further comprises a first plurality of machine readable instructions adapted to operate said control mechanism in order to acquire and store a plurality of first sensor array signature data associated with said sensor array outputs from said first DUT based on a first plurality of test signal control inputs to said first DUT and said first position input while one or more said DUT stress conditions are applied to said first DUT, wherein each of said plurality of said first sensor array signature data is respectively associated with said one or more DUT stress conditions;
- wherein said DUT control section further comprises a second plurality of machine readable instructions stored on said machine readable storage medium adapted to stimulate said second DUT when said second DUT is placed in said DUT holder with said first plurality of test signal control inputs, said DUT control section further comprises a third plurality of machine readable instructions stored on said machine readable storage medium adapted to acquire a plurality of second sensor array signature data associated with said sensor array outputs from said second DUT based on said first plurality of test signal control inputs to said second DUT and said first position input;
- wherein said DUT control section further comprises a fourth plurality of machine readable instructions stored on said machine readable storage medium adapted operate said apparatus to match said first and second sensor array signature data associated respectively with said first and second DUT, wherein a substantial match of said signature data indicates a first condition associated with said second DUT and a non-match indicates a second condition associated with said second DUT;
- an input and output section adapted to interact with said DUT control section, said input and output section comprising a user interface including a graphical user interface adapted to display an indication of said first or second condition associated with said second DUT;
- wherein said first condition comprises a DUT acceptable data indicator and said second condition comprises a DUT unacceptable data indicator;
- wherein said fourth plurality of machine readable instructions comprises a decision engine and rule base comprising a plurality of data sets associated with a plurality of conditions of interest comprising said first and second conditions, said decision engine and said rule base are operable for determining a probability that said second DUT is associated with one or more of said plurality of conditions, wherein said first condition comprises an authorized or meets specification condition and said second condition comprises an unauthorized, does not meet specification, or is defective condition;
- wherein said system further comprises a section adapted to determine multiple permutations of one or more said probability, said system comprises a control section configured for using said multiple permutations to determine an overall probability of one or more said conditions of interest which has a variety of attributes associated with one or more said DUT acceptance data and DUT rejection data;
- wherein said plurality of sensors comprise a plurality of DUT measurement and data collection/input sections comprising electromagnetic (EM) spectrum sensors and data collection sections.

11. A testing system including a system for measuring electromagnetic emissions and determining defective components_comprising:
- a machine learning system means and a sensor system means adapted to test one or more devices under test (DUT) in learning as well as evaluation modes, said sensor system means is adapted to collect a variety of test data as a part of said machine learning system associated with a known-good said one or more DUT samples subjected to simulated or generated condition of interests comprising stimulation of sections of said known-good DUT and application of one or more stress events to said known-good DUT sample, said data collected by the machine learning system means is operable to calculate probabilities data that an unknown-good DUT sample in an evaluation mode substantially matches a condition of interest comprising a DUT sample acceptance data or a DUT rejection data; and
- an input section and an output section adapted to output said probabilities data associated with said unknown-good DUT;

a control mechanism adapted to independently position elements of said sensor system means relative to areas of interest on said one or more DUT samples including said known-good DUT and said unknown-good DUT samples based on at least a first position input and data;

wherein learning modes are switched on before, during, or after evaluation mode sequencing to improve or adjust machine learning system capabilities to determine said probabilities associated with different types of said conditions of interest wherein said system is configured to determine multiple permutations of said probabilities data to determine an overall probability of one or more said conditions of interest which has a variety of attributes associated with one or more said DUT acceptance data and DUT rejection data;

wherein said learning and evaluation system means includes an artificial intelligence system comprising a neural network or a decision engine comprising a plurality of rules associated with generating said probabilities data;

wherein said learning and evaluation system means comprise a control section configured for determining a probability that said DUT comprising a microelectronic device is unauthorized, does not meet one or more elements of a specification data set, or is defective;

wherein said sensor system means comprise a plurality of DUT measurement and data collection/input sections comprising electromagnetic (EM) spectrum sensors and data collection sections.

12. A testing system comprising:

a plurality of device under test (DUT) measurement and data collection/input sections comprising electromagnetic (EM) spectrum sensors and data collection sections adapted to apply a plurality of stimulation inputs to a plurality of points on a known-good and an unknown-good DUT and respectively sense a first and second plurality of test data from said known-good and unknown good DUTs, wherein said plurality of stimulation inputs applied to said known-good DUT is applied during synchronized application of one or more life cycle simulation stress environments are applied to said known-good DUT comprising one or more of a group comprising electrostatic stress and ageing events comprising burn-in or heating of said known-good DUT associated with operational or functional capability conditions of said known-good DUT during specific points of said known-good DUT's service life;

a control mechanism adapted to independently position elements of said plurality of DUT measurement and data collection/input sections relative to areas of interest on said known-good DUT and said unknown-good DUT samples based on at least a first position input and data stored within said testing system;

one or more decision engine sections respectively associated with said plurality of DUT measurement and data collection/input sections, said one or more decision engine sections comprising a neural network, image recognition, statistical correlation section, and decision tree section, said one or more decision engines adapted to operate said DUT in a learning mode and an evaluating mode, said one or more decision engines are further adapted to receive said first and second test data from said collection/input modes at a first and second stage operable to enable said learning mode associated with said operational or functional capability conditions of said known-good DUT during its service life;

a control section operable to input said first and second test data into said multiple mode analysis decision engine to evaluate said unknown-good DUT, wherein control section is adapted for integration of said multiple EM sensors as well as said data inputs in synchronization with said plurality of DUT stimulation inputs to produce known-good DUT unique EM signatures usable by said decision engine to detect said operational or functional capability conditions of said known-good DUT in said unknown-good DUTs during said second stage;

wherein said one or more decision engines in said evaluating mode further evaluates multiple electrical characteristic modalities data sets associated with said operational or functional capability conditions of said known-good DUT during its service life with said second test data so as to determine and store or output a probability data that said unknown-good DUT is unauthorized, does not meet specification data stored within said system, or is defective;

wherein said EM spectrum sensors and data collection sections comprise a positioning system, switch matrix, power combiner, switch and EM interference (EMI) shielding to isolate or shield from EMI signals;

wherein said EM sensors further comprise probe types including one or more from the group comprising an E-field or H-field probe of varying bandwidths, visual, infra-red sensors;

wherein said one or more decision engines in said evaluating mode further comprises a control section configured for determining and storing or outputting a second probability data that said unknown-good DUT comprising a microelectronic device is unauthorized, does not meet one or more elements of a specification data set, or is defective.

* * * * *